United States Patent
Ahmed et al.

(10) Patent No.: US 8,788,897 B2
(45) Date of Patent: Jul. 22, 2014

(54) PATH-BASED CROSSTALK FAULT TEST SCANNING IN BUILT-IN SELF-TESTING

(71) Applicant: Texas Instruments, Incorporated, Dallas, TX (US)

(72) Inventors: Nisar Ahmed, Bee Cave, TX (US); Corey Jason Goodrich, McKinney, TX (US); Xiao Liu, Allen, TX (US); Chris Therrien, Trophy Club, TX (US)

(73) Assignee: Texas Instruments Incorporated, Dallas, TX (US)

( * ) Notice: Subject to any disclaimer, the term of this patent is extended or adjusted under 35 U.S.C. 154(b) by 131 days.

(21) Appl. No.: 13/631,862

(22) Filed: Sep. 28, 2012

(65) Prior Publication Data

US 2014/0095951 A1    Apr. 3, 2014

(51) Int. Cl.
*G01R 31/28* (2006.01)

(52) U.S. Cl.
USPC .............................. 714/726; 714/30

(58) Field of Classification Search
CPC ............... G01R 31/318572; G01R 31/318541
USPC .................................... 714/30, 726
See application file for complete search history.

(56) References Cited

U.S. PATENT DOCUMENTS

| | | | |
|---|---|---|---|
| 6,704,895 B1 * | 3/2004 | Swoboda et al. | 714/726 |
| 6,763,485 B2 * | 7/2004 | Whetsel | 714/726 |
| 6,848,067 B2 * | 1/2005 | Perner | 714/729 |
| 7,111,216 B2 * | 9/2006 | Nalbantis | 714/726 |
| 7,428,678 B1 * | 9/2008 | Berndt et al. | 714/729 |
| 7,437,645 B2 * | 10/2008 | Fukuyama et al. | 714/736 |
| 7,457,998 B1 * | 11/2008 | Bhatia et al. | 714/726 |
| 7,594,150 B2 * | 9/2009 | Chakraborty et al. | 714/746 |
| 7,716,542 B2 * | 5/2010 | Chang et al. | 714/718 |
| 8,078,925 B1 * | 12/2011 | Bhatia et al. | 714/726 |
| 8,386,866 B2 * | 2/2013 | Chung | 714/731 |

\* cited by examiner

*Primary Examiner* — Esaw Abraham
(74) *Attorney, Agent, or Firm* — John R. Pessetto; Frederick J. Telecky, Jr.

(57) ABSTRACT

A path-based crosstalk fault model is used in conjunction with a built-in self-test (BIST) and software capability for automatic test pattern generation. The solution allows for test patterns to be generated that maximize switching activity as well as inductive and capacitive crosstalk. The path based fault model targets the accumulative effect of crosstalk along a particular net ("victim" path), as compared with the discrete nets used in conventional fault models. The BIST solution allows for full controllability of the target paths and any associated aggressors. The BIST combined with automatic test pattern generation software enables defect detection and silicon validation of delay defects on long parallel nets.

6 Claims, 2 Drawing Sheets

PATH-BASED CROSSTALK FAULT TEST SCANNING IN BUILT-IN SELF-TESTING

BACKGROUND

As technology scales down in size, delay defects are becoming more significant. Crosstalk-aggravated delay defects can be introduced by long parallel nets. The long parallel nets provide a substantial platform for electrical coupling from multiple "aggressors" (nets from which capacitive coupling and/or mutual inductance originates) to the path of a "victim" (a net that receives the capacitive coupling and/or mutual inductance). As processing speeds increase and operating voltages decrease with the scaling of technology, conventional fault models and ATPG (automated test program generation) tools do not adequately test for accumulative crosstalk along a path or provide a method for detecting such faults during silicon validation and testing for manufacturing defects.

SUMMARY

As disclosed herein, a path-based crosstalk fault model is used in conjunction with a built-in self-test (BIST) and software capability for automatic test pattern generation. The solution allows for test patterns to be generated that maximize switching activity as well as inductive and capacitive crosstalk. The path based fault model targets the accumulative effect of crosstalk along a particular net ("victim" path), as compared with the discrete nets used in conventional fault models. The BIST solution allows for full controllability of the target paths and any associated aggressors. The BIST combined with automatic test pattern generation software enables defect detection and silicon validation of delay defects on long parallel nets.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Figure 1:
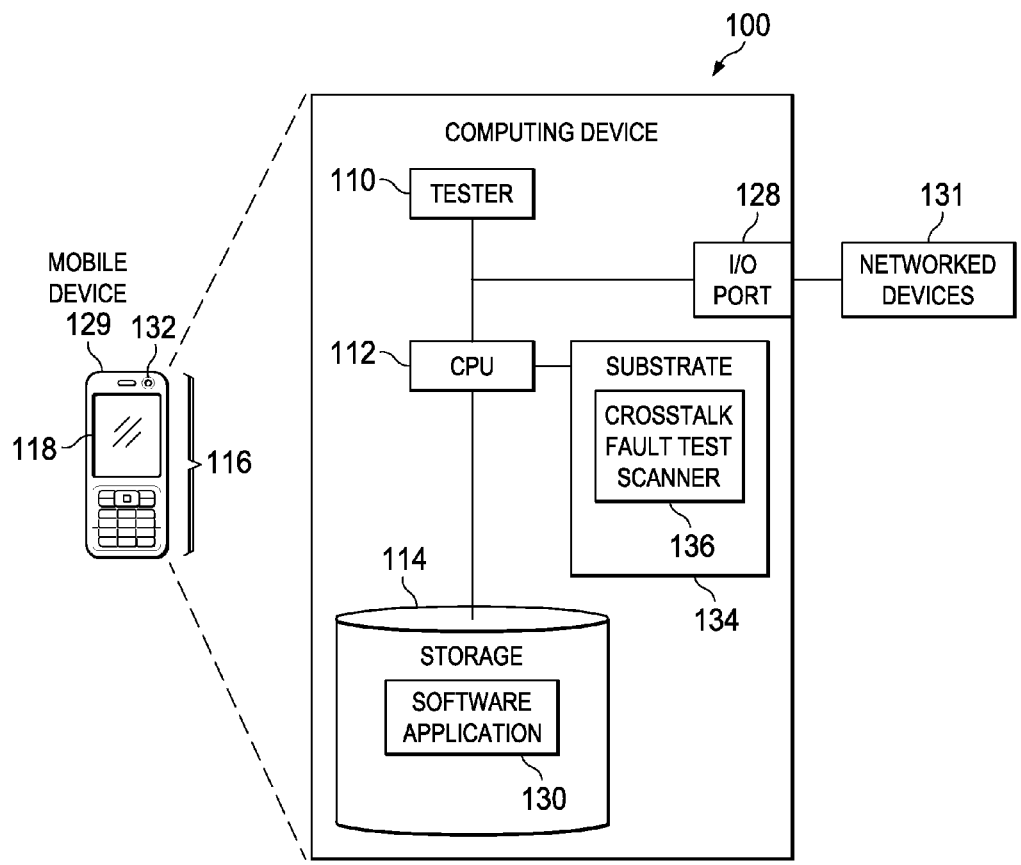
FIG. 1 shows an illustrative computing device in accordance with embodiments of the disclosure.

FIG. 1 shows an illustrative computing device 100 in accordance with embodiments of the disclosure. For example, the computing device 100 is, or is incorporated into, a communication device 129, such as a mobile phone, a personal digital assistant, a personal computer, automotive electronics, projection (and/or media-playback) unit, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100. The CPU 112 can include (or be coupled to) substrate 134, which is arranged in a common (or separate) substrate as CPU 112. Substrate 134 includes a crosstalk fault test scanner 136 that is arranged test the accumulative effect of crosstalk along particular paths by controlling the target paths and any associated aggressor nets. The crosstalk fault test scanner 136 is BIST-enabled and (when combined with a test pattern generator) enables defect detection and silicon validation of delay defects on long parallel nets on the substrate 134. The crosstalk fault test scanner 136 minimizes pin I/O (input/output) through the use of scan chain techniques.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the components would interact with the software application 130). In this way, the software application 130 can be debugged in an environment which resembles post-production operation. The tester 110, for example, performs automatic test pattern generation using a path-based crosstalk fault model to target the accumulative effects of crosstalk along particular victim paths.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, image projector 132, and the like. The input is received using audio and/or video inputs (using, for example, voice or image recognition), and mechanical devices such as keypads, switches, proximity detectors, and the like. The CPU 112 and tester 110 is coupled to I/O (Input-Output) port 128, which provides an interface (that is configured to receive input from (and/or provide output to) peripherals and/or computing devices 131, including tangible media (such as flash memory) and/or cabled or wireless media (such as a Joint Test Action Group (JTAG) interface). These and other input and output devices are selectively coupled to the computing device 100 by external devices using wireless or cabled connections.

As disclosed herein, a crosstalk fault test scanner 136 is arranged to test for delay faults on a path by controlling any likely (e.g., such as neighboring nets in a bus or nets that are susceptible to coupling to other nets having close, parallel routing segments) aggressor nets. The aggressor nets are controlled to maximize "speed up" or "slow down" of valid data on a victim net when testing hold time and setup time faults respectively of the victim net. The controllability of the aggressor nets is accomplished by inserting control structures at the launch points of the on-chip (e.g., on the same substrate) bus structures. The inserted control structures are discussed below with reference to FIG. 2.

Figure 2:
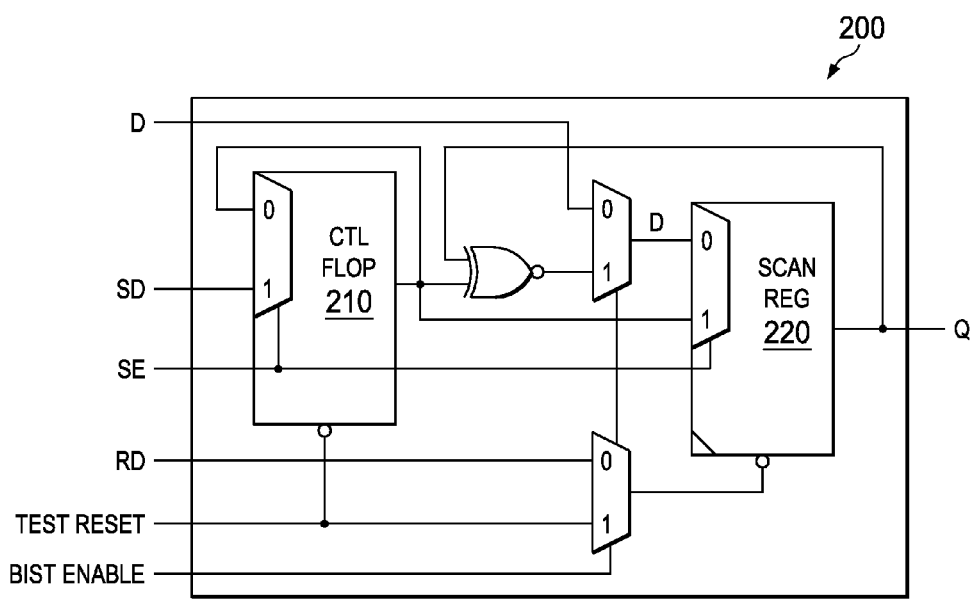
FIG. 2 is a logic diagram illustrating a control cell of a crosstalk fault test scanning system in accordance with embodiments of the disclosure.

FIG. 2 is a logic diagram illustrating a control cell of a crosstalk fault test scanning system in accordance with embodiments of the disclosure. Crosstalk fault test scanner 136 includes one or more control cells 200. Control cell 200 includes a scanning control register (CTL FLOP) 210 and functional scan register (SCAN REG) 220 wherein the scanning control register 210 is arranged to selectively control the output of the (functional) scan register in response to a test pattern generated in accordance with a path based crosstalk fault model.

The path-based crosstalk fault model is based on a principle that to test for delay faults on a selected path ("victim net"), then the substantially contributing aggressor nets are to be controlled to maximize speed up or slow down the victim net when targeting hold time and setup time faults respectively. Control cells 200 are used in place of the conventional functional registers arranged in conventional scan chain architectures.

The scanning control register 210 is transparent in functional mode and thus does not normally affect the function of the tested portion of the chip in normal operation. When in BIST (built-in self-test) mode, the control cell 200 causes the functional scan register 220 to hold its current state or to toggle the current state on a next clock edge (e.g., a positive or a negative transition) when the scanning control register 210 output value is 1 or 0 respectively. The scanning control register 210 and functional scan register 220 are arranged to be loaded and/or controlled in accordance with automated test pattern generation techniques, for example.

Figure 3:
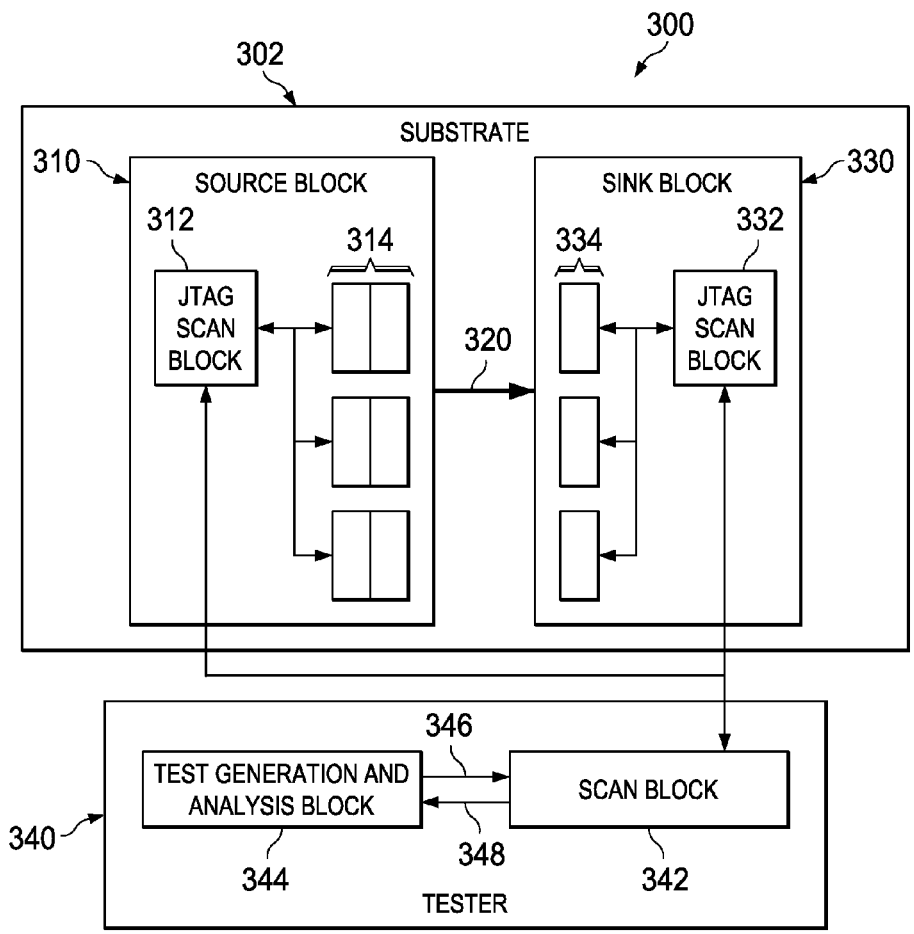
FIG. 3 is a logic diagram illustrating a crosstalk fault test scanning system in accordance with embodiments of the disclosure.

FIG. 3 is a logic diagram illustrating a crosstalk fault test scanning system in accordance with embodiments of the disclosure. Crosstalk fault test scanning system 300 includes a substrate 302 on which functional circuitry to be tested is arranged. The functional circuitry includes bus 320, which is further described below with reference to FIG. 4.

Bus 320 includes portions of victim nets to be tested using the crosstalk fault test scanning system and methods disclosed herein. Source block 310 is arranged on the substrate 302 to provide test stimulus on the substrate 302. The test stimulus is provided on the substrate 302 such that effects of the test stimulus propagate through circuitry arranged on the substrate 302, including the bus 320. Sink (receiving) block 330 is arranged on the substrate 302 to receive results of the test stimulus propagated on the substrate 302 (including the bus 320) such that the "sensitized" (e.g., controlled coupling of aggressor nets to determine, for example, a point at which the victim net fails a setup and/or hold test) victim nets can be individually tested.

Source block 310 includes a scan block such as a JTAG (joint action test group) scan block 312 and one or more control cells 314. JTAG scan block 312 is arranged to receive scan chain-conveyed test stimulus from tester 340 (which is a tester such as tester 110 described above) and to send the data to the one or more control cells 314 to be applied to the nets-under-test (for example). Accordingly, the pin-out requirements of substrate 302 are lessened, which enhances the suitability of the disclosed techniques for testing on-chip bus structures. JTAG scan block 312 operates in accordance with the IEEE (Institute of Electrical and Electronic Engineers) 1149.1 standard test access port and boundary-scan architecture.

JTAG scan block 312 is further arranged to control and convey the received scan chain stimulus to the one or more control cells 314. The one or more control cells 314 are also arranged in the input portion of the scan chain and are arranged to be transparent while in a functional mode. In the BIST mode, each control cell 314 is individually programmable to either hold the current state of the functional scan register 220 or to toggle the current state of the functional scan register 220 at a next clock transition (e.g., positive or negative transition) in response to the output value of the scanning control register 210 (of each respective control cell 314).

The output of each respective control cell 314 is used to drive individual nets of the bus 320. Because each respective control cell 314 is individually controllable, each individual selected net is testable for adverse coupling effects of, for example, adjacent nets. The adjacent nets are considered to be adjacent when the nets are in the same bus and/or sufficiently closely spaced to capacitively and/or inductively (e.g., reactively) couple a signal to the selected net. Each adjacent net can be selected by being selectively toggled (under the control of an associated control cell 314, for example) to control the degree of coupling to the selected net being tested. Thus, "aggressor" nets can also be tested as "victim" nets in response to differing test stimulus applied subsequently in testing.

Bus 320 is coupled to inputs of sink block 330 such that individual nets of bus 320 are testable. Sink block 330 includes (conventional, for example) bus net receiver scan registers 334. Each bus net receiver scan register 334 has a data input that is coupled to the output of a respective individual net of bus 320. The outputs of functional scan registers 314 arranged as a (conventional, for example) scan chain and are coupled to a scan block such as JTAG 332. JTAG scan block 332 is arranged to send scan chain received test stimulus to tester 340.

Tester 340 can be arranged on either the substrate 302 or a substrate that is different from substrate 302. Tester 340 includes scan block 342 and test generation block 344. Scan block 342 operates under the control of test 340 and is arranged, for example, to serialize data being sent to the JTAG scan block 312 of source block 310 and to de-serialize data received from the JTAG scan block 332 of sink block 330. Accordingly, scan block 342 is arranged to control the scan registers (and the disclosed control cells 200) and to switch the scan chain between functional and BIST modes.

Scan block 342 is arranged to receive stimulus test data from test generation and analysis block 344 via test bus 346. Scan block 342 is further arranged to send response test data to the test generation and analysis block via test bus 348.

Test generation and analysis block 344 is arranged to generate (and/or access) stimulus test data in accordance with the path-based crosstalk fault model as disclosed herein. Control of the BIST is accomplished with automatic test program generation (ATPG tools) and/or with tool-agnostic scan structures and customized software solutions.

For example, test generation software can be used to map the physical scan cells to register names in a design-under-test. Register mapping is used to simplify test generation by abstracting functionality of a design from a physical implementation. In register mapping, a register model is used to emulate the design functionality and is used to generate the scan chain tests. The register model is written, for example, using RTL (register transfer language). The RTL model allows for convenient programming of the tests because of the ability to model the transfer of information from one register to another. After functional tests are generated using RTL models, the functional tests are mapped back onto the physical implementation and applied to the physical implementation using one or more scan chains.

In an embodiment, a customized language is used to facilitate programming each test. The customized language contains constructs that generates test vectors in accordance with input parameters such as test type (e.g., setup time or hold time verification), bus name, a "victim" net identifier, the identifiers of one or more adjacent aggressor nets (including using all of the individual nets of the bus-under-test as an aggressor), and the like. An initialization state is programmed into the BIST and a response is calculated based on the number of test clocks provided in each test. Test signatures can be used to facilitate the analysis of test data by the test generation and analysis block 344.

When a failure is detected, the test generation and analysis block 344 generates a warning signal to provide a notice of the detected failure so that the failure information is provided to the system so as to, for example, contain error propagation (e.g., erroneous information that would otherwise be propagated through the system). The "sensitivity" of each net can be determined by iteratively and progressively changing parameters of a net (e.g., "sensitizing the net") to determine the parametric boundaries of an operating space at which failures (e.g., being to occur). For example, the numbers and types of coupled aggressor nets can be gradually increased over series of increasing clock rates (as controlled by nested "for" loops, for example) to determine points at which the circuit is vulnerable to errors. Thus defective modules and/or unsafe operating conditions can be identified by using a predefined set of ranges over which a safe operating space is defined. Likewise, the test parameters can be specified by the user to locate sensitive nets. The information can be fed-back to a routing engine to produce a more optimal routing solution, for example, that is less susceptible to errors (and thus is more robust) in a design environment for the chip-under-test.

A final golden signature can be stored in a memory mapped register (that, for example, which can be read by another processor in another substrate and/or electrically separate die) to provide an ability to certify the correctness of the BIST-tested logic. The final signature comparison between an obtained signature and the stored final golden signature can be performed in a separate die to maximize the assurance of the proper operation of the chip-, bus-, and/or net-under test.

Although test generation and analysis block 344 can be used to test an entire design (including an SoC) or a partial design such as a semi-custom core (e.g. CPU, DSP, and the like), the test generation and analysis block 344 can also be used to test module-level components in a design on the same (or different) substrates 302. For simplicity of discussion, an embodiment is described where (only, for example) a single module is built-in self-tested ("BISTed"), and the remaining logic to self-test other such modules is not necessarily described. (Other embodiments BIST an entire portion of the design, for example, without loss of applicability of the teachings disclosed herein.)

Figure 4:
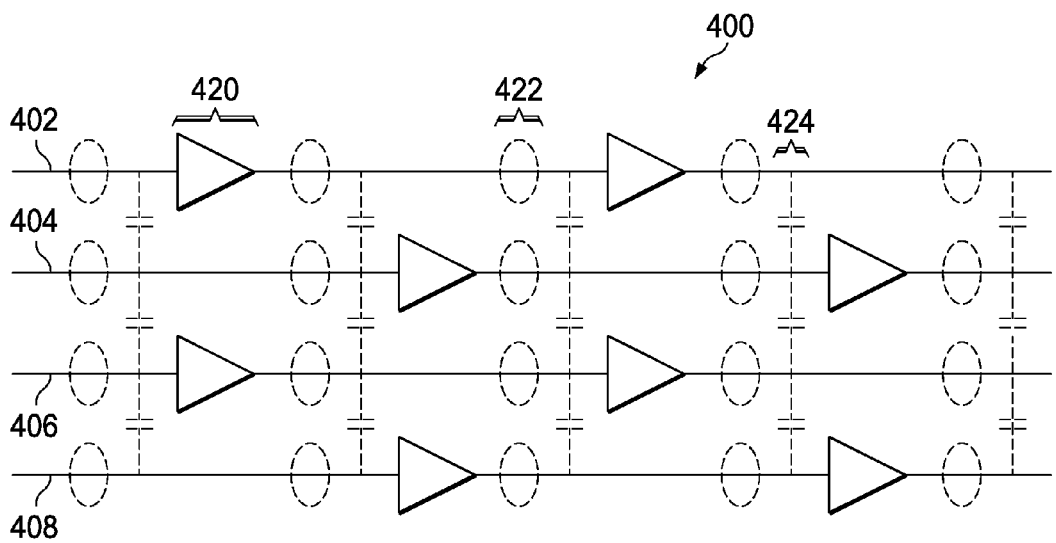
FIG. 4 is a schematic diagram illustrating a bus-under-test of a crosstalk fault test scanning system in accordance with embodiments of the disclosure.

FIG. 4 is a schematic diagram illustrating a bus-under-test of a crosstalk fault test scanning system in accordance with embodiments of the disclosure. For simplicity, bus 400 (which is a bus such as bus 320) is illustrated as having four nets: namely net 402, net 404, net 406 and net 408. Net 402, net 404, net 406 and net 408 possess transmission line-like characteristics such as impedance loss due to serial resistance (not shown), serial inductance 422, and parallel capacitance 424. Accordingly, net 402, net 404, net 406 and net 408 include repeaters (e.g., buffers 420) to amplify and reconstitute a signal that is propagated through each of the respective nets. As discussed above, the repeaters can be arranged using inverters (although using inverters entails substantial processing power to account for inversions of logic state at differing points in the aggressor nets and to calculate a cumulative reactive coupling effects of the aggressor nets upon a victim nets For maximum control of the path-based crosstalk fault testing as disclosed herein, the repeaters in the bus 400 are implemented as non-inverting buffers. Using non-inverting buffers (as a general rule) greatly simplifies the problem of crosstalk control for silicon validation and manufacturing tests. With non-inverting buffers, the switching polarity of any net is primarily a function of the switching polarity of the register driving the path. With this scheme, the net inversion from the driver to the aggressor nets need not be considered, and thus worst-case test patterns can easily be generated.

When inverters (instead of non-inverting buffers) are used as repeaters, the control scheme can still be implemented; however, substantial additional computation is typically required for each test. The computations used to identify the most significant aggressor nets are greatly increased (when inverters are used to amplify the nets) because of having to account for the logic state of each net inversion from the driver register through the aggressor net. Using the logic inversion information, the worst-case cross talk patterns can still be implemented, but at typically at increased test generation costs.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A control cell, comprising a functional scan register having a data input that is arranged as part of a first scan chain and that is arranged to provide an output in response to a scan chain input; and a scanning control register having a control input wherein the scanning control register is arranged as part of a second scan chain that is arranged to provide an output when operating in a scan chain test mode that is arranged to selectively control the output of the functional scan register;

wherein the scanning control register is arranged to be transparent when not operating in the scan chain test mode;

wherein an input from the first scan chain is latched by the functional scan register and is output by the functional scan register when the output of the scanning control register is a binary logical high value;

wherein the output of the functional scan register is arranged to toggle when the output of the scanning control register is a binary logical low value;

wherein the output of the functional scan register is at least one of capacitively and inductively coupled to a net-under-test.

2. The control cell of claim 1, wherein the net-under-test is arranged to be tested for crosstalk effects.

3. A crosstalk scanning system, comprising:

one or more control cells each of which includes a functional scan register having a data input that is arranged as part of a first scan chain and wherein the functional scan register is arranged to provide an output in response to an input received from the first scan chain and a scanning control register having a control input wherein the scanning control register is arranged as part of a second scan chain that is arranged to provide an output when operating in a scan chain test mode that is arranged to selectively control the output of the functional scan register;

wherein the scanning control register is arranged to be transparent when not operating in the scan chain test mode;

a signal bus having nets each of which are driven by a respective output of the one of the one or more control cells; and one or more bus net receiver scan registers each of which includes a functional scan register having an input coupled to a respective net of the signal bus and that is arranged to provide an output to a third scan chain in response to an input received from the respective net of the signal bus.

4. The crosstalk scanning system of claim 3, wherein the one or more control cells, the signal bus, and the one or more bus net receiver scan registers are arranged on a common substrate.

5. The crosstalk scanning system of claim 4, further comprising a tester that is coupled to the one or more control cells and the one or more bus net receiver scan registers, and wherein the tester is arranged to provide a stimulus to the signal bus using the one or more control cells to determine a sensitivity of a net of the signal bus to cross-coupling from one or more other nets of the signal bus and to receive a response from the one or more bus net receiver scan registers, that varies as a function of the sensitivity of the net of the signal bus to cross-coupling.

6. The crosstalk scanning system of claim 4, wherein the tester is arranged on a substrate that is different from the common substrate on which the one or more control cells, the signal bus, and the one or more bus net receiver scan registers are arranged.

* * * * *